US009911584B2

(12) United States Patent
Frisch et al.

(10) Patent No.: US 9,911,584 B2

(45) Date of Patent: Mar. 6, 2018

(54) BATCH PRODUCTION OF MICROCHANNEL PLATE PHOTO-MULTIPLIERS

(71) Applicant: The University of Chicago, Chicago, IL (US)

(72) Inventors: Henry J. Frisch, Chicago, IL (US); Matthew Wetstein, Ames, IA (US); Andrey Elagin, Bolingbrook, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 15/468,371

(22) Filed: Mar. 24, 2017

(65) Prior Publication Data

US 2017/0278687 A1 Sep. 28, 2017

Related U.S. Application Data

(60) Provisional application No. 62/312,852, filed on Mar. 24, 2016.

(51) Int. Cl.

| | |
|---|---|
| ***H01L 21/00*** | (2006.01) |
| ***H01J 40/16*** | (2006.01) |
| ***H01J 9/12*** | (2006.01) |
| ***H01J 43/06*** | (2006.01) |

(52) U.S. Cl.

CPC ................ *H01J 40/16* (2013.01); *H01J 9/12* (2013.01); *H01J 43/06* (2013.01)

(58) Field of Classification Search

CPC ........................................................ H01L 21/00

See application file for complete search history.

(56) References Cited

U.S. PATENT DOCUMENTS

| | | | |
|---|---|---|---|
| 8,604,440 B2 | 12/2013 | Frisch et al. | |
| 9,244,180 B2 | 1/2016 | Frisch et al. | |
| 9,625,588 B2 * | 4/2017 | Frisch | G01T 1/208 |

OTHER PUBLICATIONS

The Development of a Non-Vacuum Transfer Process for Large-volume Commercial Tile Production, Document available on the web, Oct. 14, 2012.

* cited by examiner

*Primary Examiner* — Marvin Payen

(74) *Attorney, Agent, or Firm* — Bell & Manning, LLC

(57) ABSTRACT

In-situ methods for the batch fabrication of flat-panel micro-channel plate (MCP) photomultiplier tube (PMT) detectors (MCP-PMTs), without transporting either the window or the detector assembly inside a vacuum vessel are provided. The method allows for the synthesis of a reflection-mode photocathode on the entrance to the pores of a first MCP or the synthesis of a transmission-mode photocathode on the vacuum side of a photodetector entrance window.

8 Claims, 5 Drawing Sheets

BATCH PRODUCTION OF MICROCHANNEL PLATE PHOTO-MULTIPLIERS

CROSS-REFERENCE TO RELATED APPLICATIONS

The present application claims priority to U.S. provisional patent application no. 62/312,852 that was filed Mar. 24, 2016, the entire contents of which are hereby incorporated by reference.

REFERENCE TO GOVERNMENT RIGHTS

This invention was made with government support under DE-SC0008172 awarded by the U. S. Department of Energy and under PHY1066014 awarded by The National Science Foundation. The government has certain rights in the invention.

BACKGROUND

MCP-PMT's are unique in having the capability of 10-micron pixel size, psec-level time-resolution, high gain, and low noise. Recent developments have made possible the coverage of large areas by advances in capillary substrate manufacture, resistive and emissive coatings, and fast economical electronics systems.

A dominant barrier to adoption of MCP-PMT technology is cost. The cost is dominated by the complex one-at-a-time production and assembly process, and by process yield. A typical MCP-PMT commercial fabrication process is much more expensive than the production of conventional PMTs due to the synthesis of the photocathode inside a large vacuum vessel that must be heated to a high temperature, followed by transfer of the cathode inside the vacuum, rather than synthesis in place inside the much smaller photodetector package, as is done with PMTs. The flat planar form-factor of MCP-PMTs prohibits using the same process as for deposition in PMTs; each MCP-PMT has to be assembled inside a tank after the photocathode has been separately deposited on the window. The typical production process for PMTs, in contrast, synthesizes the photocathode inside the detector's glass tube envelope, allowing batch production and consequently a higher yield and lower cost.

Current commercial processes produce MCP-PMT photodetectors with a transmission-mode photocathode. In this geometry, the photocathode is deposited as a film on the vacuum side of the window. The film absorbs the incoming photon, and therefore is better when it is optically thick; however, the electron has to be ejected from the vacuum side, opposite to where the photon enters, and so the efficiency of ejecting a photoelectron is better for a thin film. These conflicting requirements on the film thickness lead to an inherent inefficiency, and a sensitive dependence on film thickness during manufacture, affecting yield. In contrast, a reflection-mode cathode is deposited on a surface facing the incident photon's path; the electron is ejected from the same surface, and since it does not have to traverse the photocathode, the film can be very thick or even non-uniform without any effect on performance. Because the film is thicker, photocathodes in reflection-mode typically have higher Quantum Efficiency (QE) than in transmission-mode.

SUMMARY

In situ methods of fabricating a reflection-mode photocathode in a microchannel plate photomultiplier tube detector are provided. One embodiment of such a method includes forming an unsealed detector outer package that includes: a window having an outer surface and an inner surface, wherein the inner surface faces opposite the outer surface; and a detector body comprising: (i) a base plate having an outer surface and an inner surface, the inner surface facing opposite the outer surface, wherein the window and the base plate are spaced apart and face each other in a substantially parallel arrangement, such that the inner surface of the window faces the inner surface of the base plate; and (ii) a side wall that separates the window from the base plate, wherein the side wall, the base plate, or both has one or more conduits extending through it. A microchannel plate detector is then provided in the unsealed detector package. The microchannel plate detector comprises: at least one microchannel plate having a cathode surface that is coated with a photocathode precursor material and that faces the inner surface of the window and a second surface that faces opposite the cathode surface; at least one spacer that separates the at least one microchannel plate from the window; and at least one spacer that separates the at least one microchannel plate from the base plate. The window is sealed to the detector body to form a sealed detector outer package, which is evacuated through the one or more conduits. An alkali metal-containing vapor is introduced into the evacuated sealed detector outer package through the one or more conduits, wherein the alkali metal-containing vapor reacts with the photocathode precursor material to form a photocathode material on the cathode surface of the at least one microchannel plate. If excess alkali metal-containing vapor it present, it may be evacuated from the sealed detector enclosure through the one or more conduits. Finally, the one or more conduits are sealed.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1:
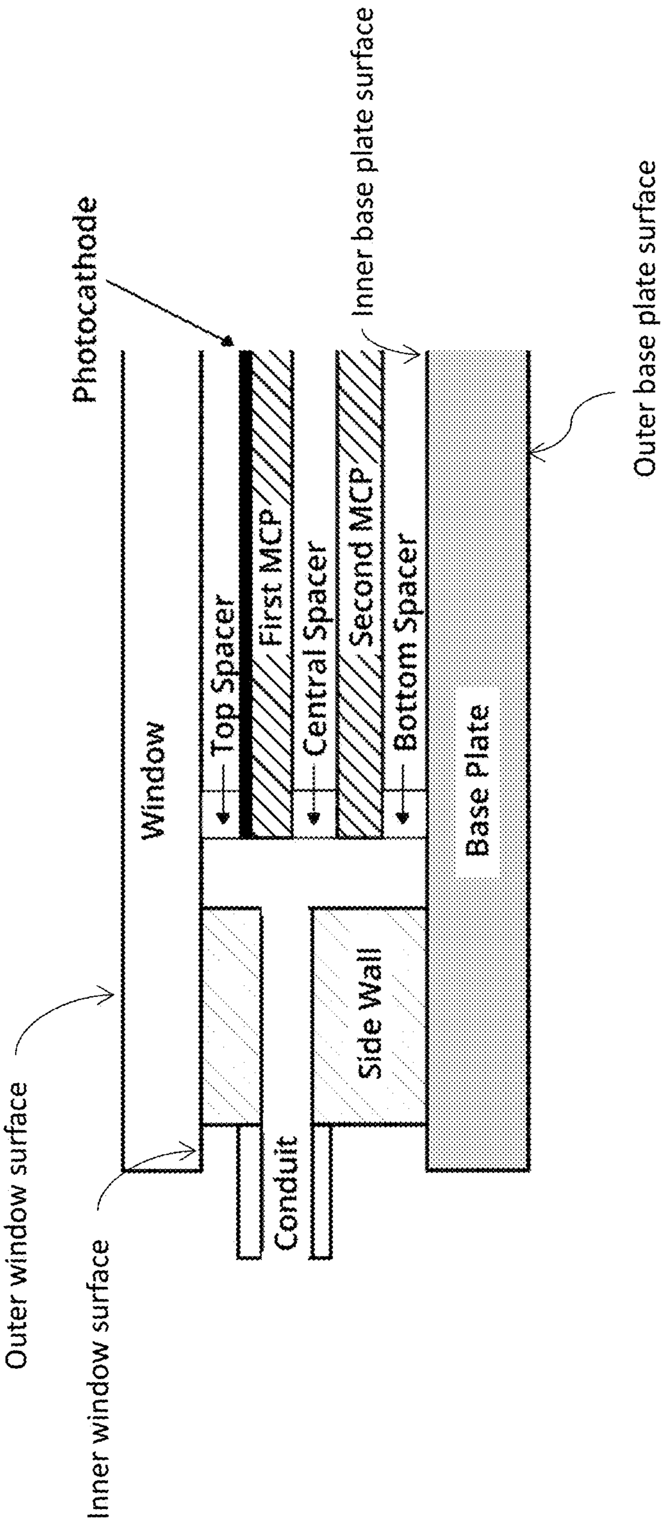
FIG. 1: A side view of one embodiment of the reflection mode MCP-PMT geometry showing a conduit through a side wall into the volume defined by the detector enclosure, the amplification stack of two MCPs and spacers, and the placement of the photocathode material on the cathode surface of the upper MCP. There may also be a fine metallic grid or transparent conducting film on the inner surface of the top window to provide a clearing field in the upper volume.

One aspect of the invention is an "in-situ" method for the batch fabrication of flat-panel micro-channel plate (MCP) photomultiplier tube (PMT) detectors (MCP-PMTs) without transporting either the window or the detector assembly inside a vacuum facility (i.e., without "vacuum transfer"). The method allows for the synthesis of a reflection-mode photocathode on the entrance to the pores of a first MCP or the synthesis of a transmission-mode photocathode on the vacuum side of the detector entrance window. The "in-situ" method involves the synthesis of the photocathode film after the window has been sealed to a package base, with the advantages of, in certain embodiments, allowing: a) large-scale parallel production using multiple small-volume, low thermal-mass vacuum vessels and a short thermal cycle; b) synthesis inside a photodetector package of a transmission-mode photocathode; c) synthesis of a reflection-mode photocathode with higher operational performance (e.g., quantum efficiency, uniformity, and/or robustness) than transmission-mode, due to shorter path lengths of the electron drift at the start of the shower; d) access to the sealed detector for assessing the hermeticity and electrical integrity before starting cathode synthesis; e) access to the full surface of the detector for measuring cathode quantum efficiency and uniformity during photocathode synthesis; and/or f) access to the full surface of the detector for high-bandwidth pulse diagnostics. In addition, the in-situ photocathode fabrication methods described herein allow for the fabrication of both reflection-mode and transmission-mode photocathode geometries in a single facility.

The present methods, which can be referred to as "in-situ" synthesis, as opposed to "vacuum-transfer" synthesis, allow for a rapid production cycle of MCP-PMTs, including, in certain embodiments, parallel batch processing and the production of photomultiplier tubes with either reflection-mode or transmission-mode photocathodes in the same facility. As a result, the production facility may be substantially less expensive and physically smaller. The net effect can be a substantially reduced cost, allowing adoption of MCP-PMTs in a number of areas of imaging for which the cost was previously prohibitive and the ability to cover large areas was previously uneconomical.

Certain embodiments of the methods allow for the assessment of the hermeticity, mechanical tolerances, and/or electrical parameters before photocathode synthesis. If a phototube is deficient it is consequently caught early in the production process when errors can be corrected and the process restarted with less loss of time.

Certain embodiments of the methods also allow measuring photocathode efficiency and uniformity, as well as high-bandwidth pulse measurements, during and after photocathode synthesis.

The area of coverage and the QE of the photocathode determine the cost of large photodetector installations. In many applications, a higher QE per photodetector allows the use of fewer detectors for the same effective coverage. A photocathode in a reflection-mode geometry provides higher QE than one in transmission-mode. Reflection-mode photocathodes are more robust to manufacture, being less sensitive to the cathode film thickness, which results in a higher yield and a smaller spread in performance among the produced photodetectors. The placement of the cathode on the top surface of the top microchannel plate also shortens the drift path of the electrons, with most amplification cascades starting directly in a single capillary pore. This localization has inherently better space and time resolution than for the conventional transmission-mode cathode on the window across a vacuum gap from the pores. In addition, in certain embodiments, advanced MCP designs with customized pore shapes and surfaces can take advantage of the proximity and integration of a reflection-mode photocathode with the tailored pore geometry.

Figure 2:
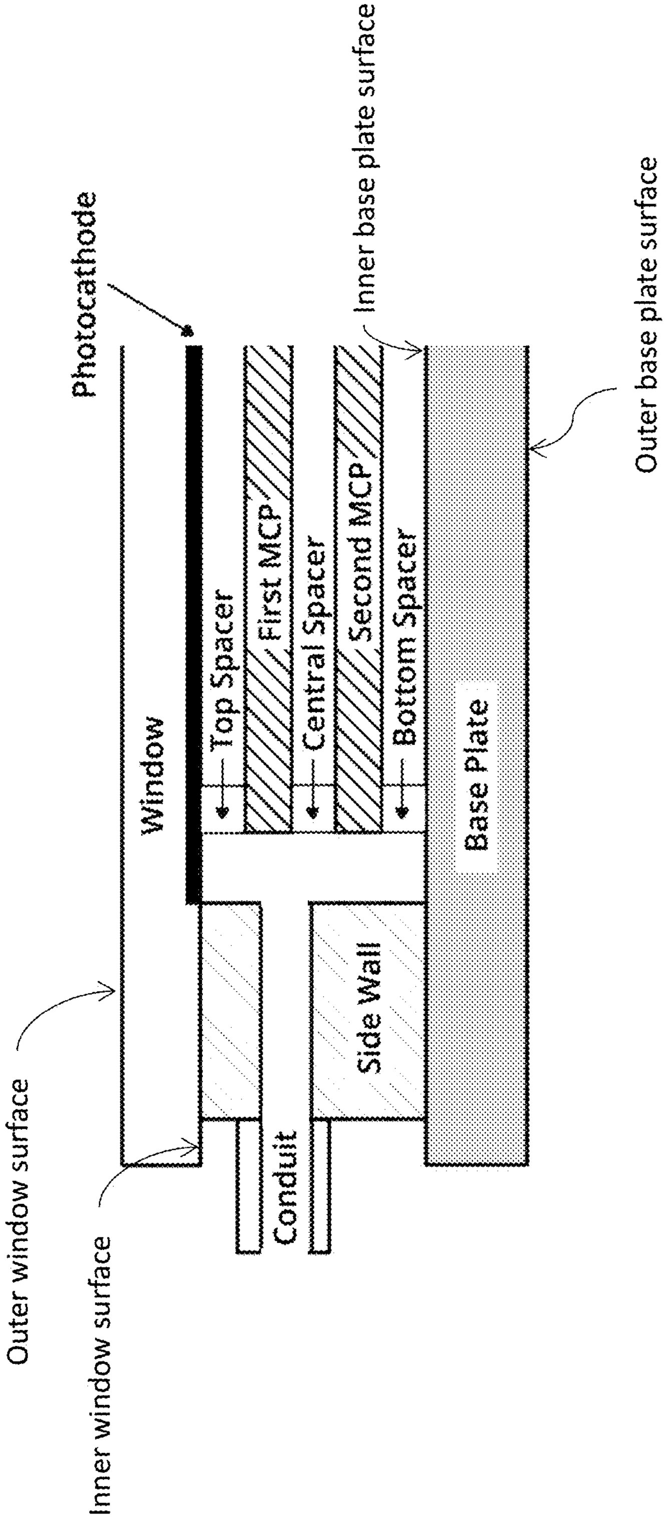
FIG. 2: A side view of one embodiment of the transmission-mode MCP-PMT geometry showing a conduit through a side wall into the volume defined by the detector enclosure, the amplification stack of two MCPs and spacers, and the placement of the photocathode material on the vacuum-side surface of the entrance window.

By way of illustration, an "in-situ" method for the fabrication of a chevron-style photodetector with an amplification section having two MCPs (i.e., a First MCP and a Second MCP) is provided. FIG. 1 is a cross-sectional side view of a reflection-mode MCP-PMT geometry in which the photocathode is synthesized on the top (i.e., window-facing) surface of the First PMT. FIG. 2 is a cross-sectional side view of a transmission-mode MCP-PMT geometry in which the photocathode is synthesized on the vacuum facing surface of the First PMT. In both embodiments, the First MCP is spaced apart from the entrance window with a spacer (the "Top Spacer"), the First and Second MCP are spaced apart from one another with a second spacer (the "Central Spacer"), and the Second MCP is spaced apart from a Base Plate with a third spacer (the "Bottom Spacer"). The photodetectors are sealed around the exterior edge by a side wall. Together, the window, side wall, and base plate provide a detector outer package into which the MCP can be sealed.

The methods are not limited to the particular style of photodetectors shown in FIGS. 1 and 2, and would apply to other MCP configurations, such as a single MCP or a "Z-stack" of more than two MCPs, for example.

Figure 3:
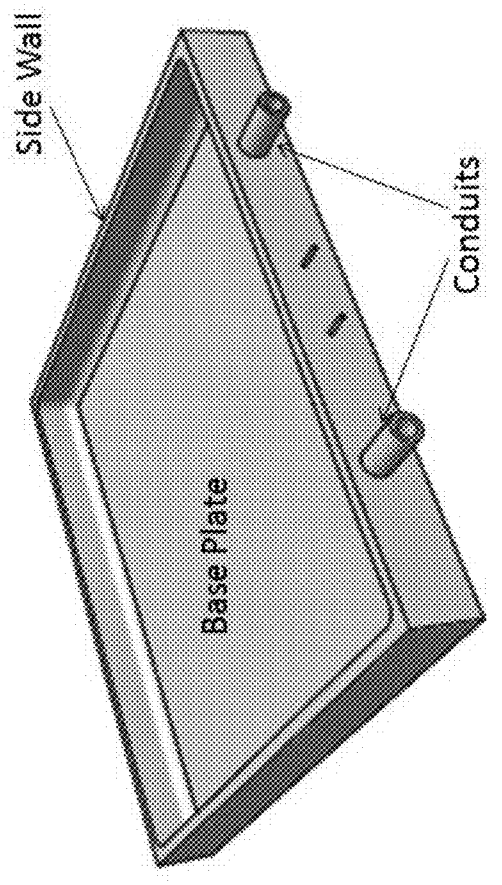
FIG. 3: One implementation of a detector body showing two conduits through which the alkali vapors for photocathode synthesis are introduced to the detector body. The MCPs would be stacked inside the body and separated from one another and from the body and the window by spacers.

The steps for one embodiment of a method for the batch fabrication of a MCP-PMT detector with a photocathode synthesized "in-situ" include:

1. Constructing a hermetic flat detector body with one or more conduits (also referred to as conduits) extending from outside of the detector body to the interior of the detector body, through which alkali metal-containing vapors can be introduced and through which the sealed detector body can be evacuated. After evacuation, the conduit(s) can be hermetically pinched off. FIG. 3 shows a perspective view of one embodiment of a flat detector body composed of a base plate and side walls with two conduits that extend through the side wall.
2. Preparing an entrance window that, with the flat detector body, forms the detector outer package. Optionally, metal electrodes can be deposited on the vacuum-side surface of the window to provide electrical contact and supple high voltage (HV) to the vacuum-side of the window. In some embodiments, it a fine metallic grid or transparent conducting film is deposited on the vacuum side of the window in a refection-mode photocathode to eliminate long residencies of ions in the gap between the window and the top MCP.
3. Preparing the "in-situ" photocathode substrate by depositing a coating (or "base layer") of a photocathode precursor material on the surface that will serve as the photocathode substrate, for example the window-facing surface of the First MCP, when the device is fully assembled. The photocathode precursor material is a material that reacts with the alkali metal-containing vapors to form a photocathode material. Examples of photocathode precursor materials include antimony (Sb), another Group V metal, or a semiconductor, such as a Group III-V semiconductor, for example GaN. In the instance of a reflection-mode photocathode, the photocathode substrate is the MCP surface closest to the window. In the instance of a transmission-mode photocathode, the substrate is the vacuum-side surface of the entrance window.

Figure 4:
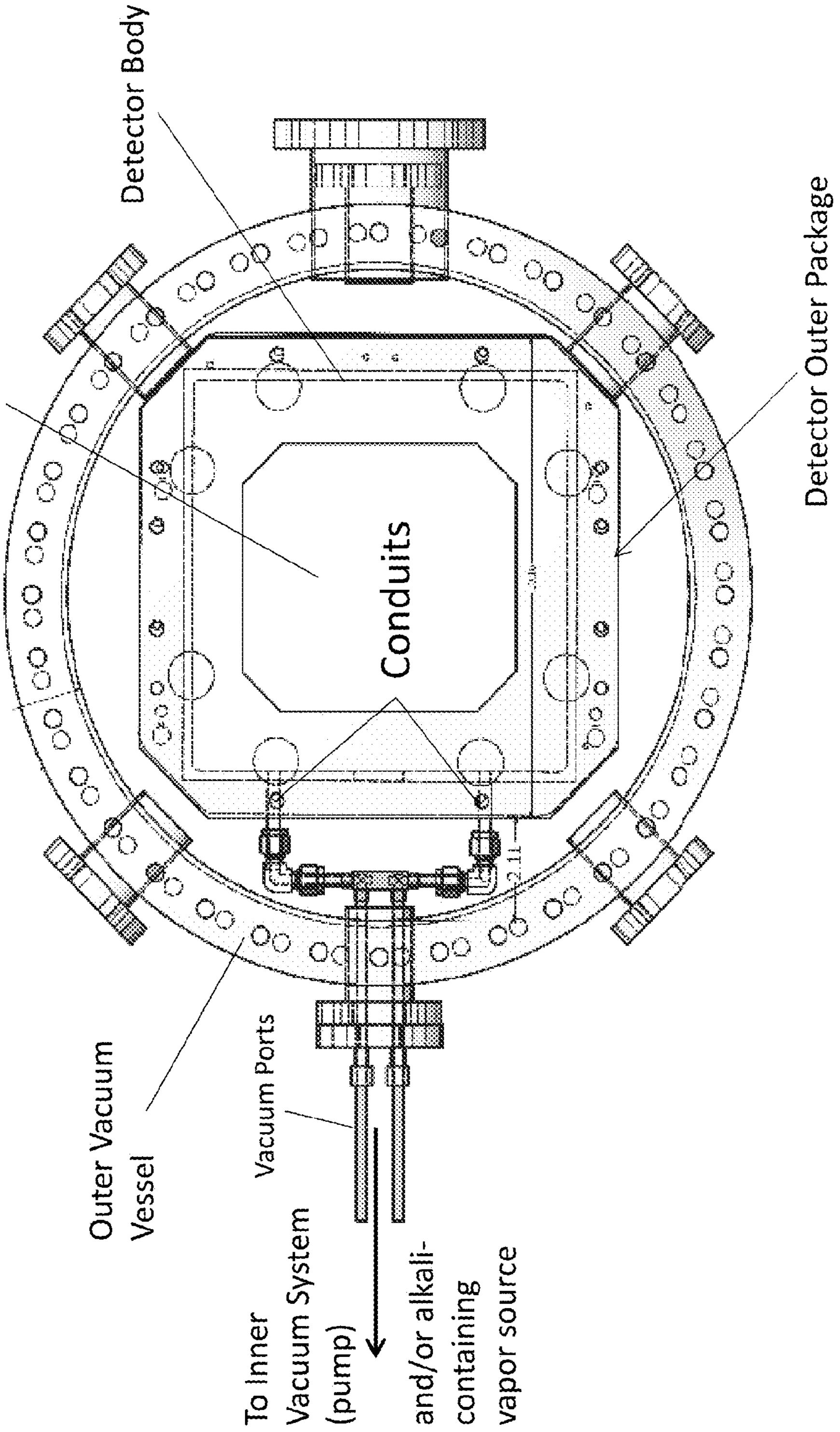
FIG. 4: A plan view of the design of the "in-situ" detector fabrication vacuum facility showing the outer vacuum vessel, the detector body, the vacuum port for the vessel vacuum pump connection, and the conduits for the detector body vacuum pump connection.

4. The detector body, internal MCP-spacer stack, and window are assembled inside of an outer vacuum vessel prior to evacuation, as shown in FIG. 4, which depicts a top view of the assembled photodetector inside an outer vacuum vessel. In the outer vacuum vessel, the MCP-spacer stack is disposed in the detector body and the window is then aligned with, and sealed to, the detector body using, for example, a solder seal material. The conduits are connected to an inner vacuum system (e.g., a pumping apparatus) that is configured to evaluate the interior of the detector outer package.
5. The outer vacuum vessel (also referred to as the "vacuum facility") is then sealed and evacuated, while simultaneously evacuating the interior of the sealed detector outer package using the inner vacuum system in equilibrium.
6. The detector assembly inside the outer vacuum vessel can then be heated independently for vacuum bake-out and the formation of a molten solder seal between the window and the detector body. The formation of the seal can be carried out without lateral motion of either the window or the detector body.
7. The detector is then cooled and the outer vacuum vessel opened to atmospheric pressure to allow access to the detector body, which is still connected to the inner vacuum system through the conduits. (FIG. 4).
8. Optionally, diagnostic equipment can be installed on the detector window for photocathode scanning and pulse detection.
9. In certain embodiments, cleaning the photocathode precursor base layer of oxide by chemical reduction, plasma etch, flash desorption, temperature cycling, or equivalent can be carried out.
10. Next, a photocathode can be synthesized in situ inside the sealed photodetector assembly by introducing alkali metal-containing vapor or vapors from an alkali metal-containing vapor source or sources through the conduit (s). Optionally, the quantum efficiency and uniformity of the photocathodes can be monitored as it is formed. Examples of alkali metal-containing vapors include vapors comprising potassium and/or cesium. For example, $K_2Cs$ can be introduced into the sealed detector outer package through the conduits. If more than one alkali metal-containing vapor is used, the vapors can be introduced singly or as a premixed binary compound. In certain embodiments, multiple cycles of alkali metal-containing vapor(s) and vacuum pumping can be applied before and during photocathode synthesis. By way of illustration only, if Sb is deposited as the photocathode precursor material on a surface of an internal detector component (e.g. the window-facing surface of an MCP), a $K_2CsSb$ photocathode material can be synthesized "in situ" by introducing the potassium- and cesium-containing vapor or vapors through the conduit(s) in the detector body after hermetically sealing the window to the detector body. As another illustrative example, if GaN is deposited as the photocathode precursor material on a surface of an internal detector component (e.g. the window-facing surface of an MCP), a Cs-activated photocathode material can be synthesized "in situ" by introducing a cesium-containing vapor or vapors through the conduit(s) in the detector body after hermetically sealing the window to the detector body.
11. The tubulations can then be closed and the finished photodetector can be removed from the outer vacuum vessel. The conduits can be closed, for example, by flame-sealing if glass or by a cold-weld pinch if copper or similar metal.

Figure 5:
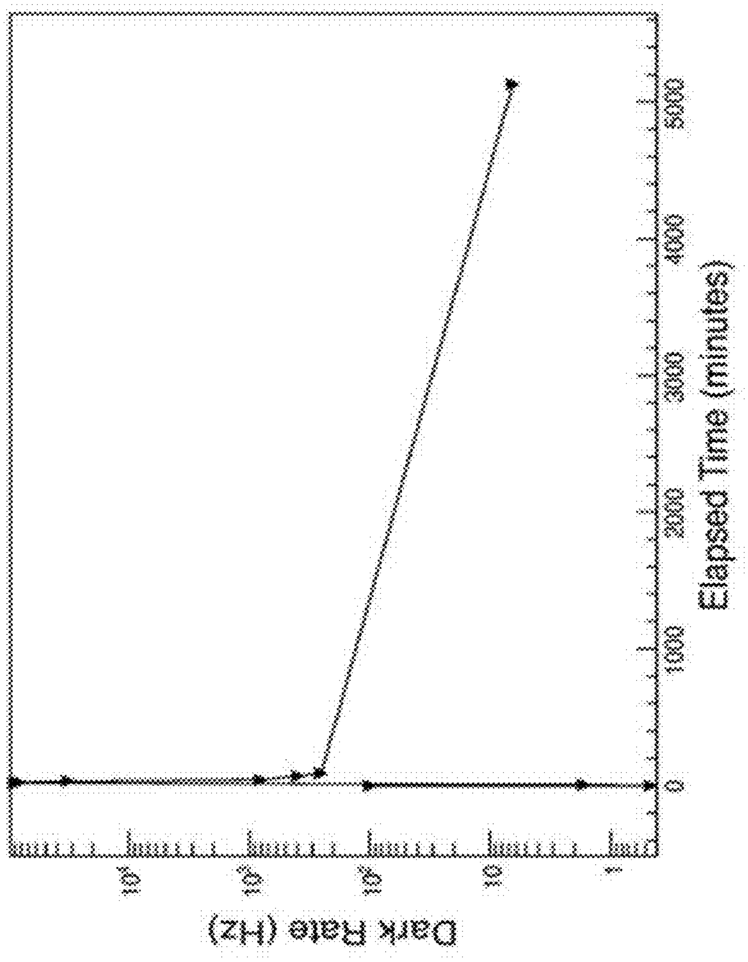
FIG. 5: The measured dark current rates in Hz from a pair of ALD-functionalized MCPs as a function of time elapsed after the introduction of Cs vapor in a test cell.

In order to test whether the alkali metal-containing vapors might induce dark current in the micro-channel plates, cesium was injected into a test chamber and the dark current in a pair of ALD-functionalized MCPs was recorded as a function of time. The results are presented in FIG. 5. A sharp spike was observed in the count rate, subsiding to an acceptable rate after several hours and to the pre-cesiation level in several days. There was no measured long-term degradation in MCP gain or uniformity, or any other measure of performance. If the presence of water in the detector body leads to a decrease in the resistance of the MCPs when cesium is introduced, drying the MCPs can restore the initial resistance.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A method of fabricating a reflection-mode photocathode in a microchannel plate photomultiplier tube detector, the method comprising:

(a) forming an unsealed detector outer package comprising:

a window having an outer surface and an inner surface, wherein the inner surface faces opposite the outer surface; and a detector body comprising: (i) a base plate having an outer surface and an inner surface, wherein the window and the base plate are spaced apart and face each other, such that the inner surface of the window faces the inner surface of the base plate; and (ii) a side wall that separates the window from the base plate, wherein the side wall, the base plate, or both has one or more conduits extending through it;

(b) providing a microchannel plate detector in the unsealed detector package, the microchannel plate detector comprising:

a microchannel plate having a cathode surface that is coated with a photocathode precursor material and that faces the inner surface of the window; and at least one spacer that separates the microchannel plate from the window; and at least one spacer that separates the microchannel plate from the base plate;

(c) sealing the window to the detector body to form a sealed detector outer package;

(d) evacuating the sealed detector outer package through the one or more conduits;

(e) introducing an alkali metal-containing vapor into the evacuated sealed detector outer package through the one or more conduits, wherein the alkali metal-containing vapor reacts with the photocathode precursor material to form a photocathode material on the cathode surface of the microchannel plate; and sealing the one or more conduits.

2. The method of claim 1, wherein the photocathode precursor material comprises a Group V element.

3. The method of claim 2, wherein the photocathode precursor material is Sb and the alkali metal-containing vapors comprise K and Cs.

4. The method of claim 3, wherein the photocathode material comprises $K_2CsSb$.

5. The method of claim 2, wherein the photocathode precursor material is Sb and the alkali metal-containing vapor comprises vaporized $K_2Cs$ molecules.

6. The method of claim 5, wherein the photocathode material comprises $K_2CsSb$.

7. The method of claim 1, wherein the photocathode precursor material comprises a Group III-V semiconductor alloy.

8. The method of claim 7, wherein the photocathode precursor material is a GaN semiconductor alloy, the alkali metal-containing vapor comprises Cs, and the photocathode material comprises a Cs-activated GaN semiconductor alloy.

* * * * *